US00RE44525E

(19) United States
(12) Reissued Patent
Chieng et al.

(10) Patent Number: US RE44,525 E
(45) Date of Reissued Patent: Oct. 8, 2013

(54) SYSTEMS AND METHODS FOR OVER-CURRENT PROTECTION

(75) Inventors: Daniel L. W. Chieng, Austin, TX (US); Michael A. Kost, Cedar Park, TX (US); Jack B. Andersen, Cedar Park, TX (US); Larry E. Hand, Meridian, MS (US); Wilson E. Taylor, Austin, TX (US)

(73) Assignee: D2Audio Corporation, Milpitas, CA (US)

(21) Appl. No.: 13/207,232

(22) Filed: Aug. 10, 2011

Related U.S. Patent Documents

Reissue of:
(64) Patent No.: 7,286,010
Issued: Oct. 23, 2007
Appl. No.: 11/340,139
Filed: Jan. 26, 2006

(51) Int. Cl.
*H03F 3/38* (2006.01)

(52) U.S. Cl.
USPC ..... 330/10; 330/298

(58) Field of Classification Search
USPC ..... 330/10, 298, 207 P, 146
See application file for complete search history.

(56) References Cited

U.S. PATENT DOCUMENTS

| | | | | |
|---|---|---|---|---|
| 4,530,026 | A * | 7/1985 | Noro | 361/88 |
| 5,050,172 | A | 9/1991 | Elms et al. | |
| 5,510,753 | A * | 4/1996 | French | 330/146 |
| 5,973,569 | A * | 10/1999 | Nguyen | 330/298 |
| 6,038,516 | A | 3/2000 | Alexander et al. | |
| 6,229,389 | B1 * | 5/2001 | Pullen et al. | 330/10 |
| 6,498,531 | B1 | 12/2002 | Ulrick et al. | |
| 6,683,494 | B2 | 1/2004 | Stanley | |

(Continued)

FOREIGN PATENT DOCUMENTS

| | | |
|---|---|---|
| JP | 08-330875 | 12/1996 |
| JP | 2003-037452 | 2/2003 |
| JP | 2004-22251 | 8/2004 |
| WO | WO 2004/086616 | 10/2004 |

OTHER PUBLICATIONS

European Search Report for European Patent Application No. 07717391.2, dated Oct. 21, 2009.

(Continued)

*Primary Examiner* — Henry Choe
(74) *Attorney, Agent, or Firm* — Vierra Magen Marcus & DeNiro LLP

(57) ABSTRACT

Systems and methods for over-current protection in all-digital amplifiers using low-cost current sensing mechanisms. An over-current hard clipping unit receives a digital audio signal, clips the signal according to a clip level, and provides the signal to a modulator. The modulator modulates the signal to produce, e.g., a PWM signal and provides the modulated signal to an output stage which generates an output current to drive a speaker. An over-current sensing unit is compares the output current to a threshold value and generates a binary signal indicating whether the output current exceeds the threshold value. The hard clipping unit receives the binary signal and ramps down the clip level during time periods in which the binary signal indicates that the output current exceeds the threshold. When the binary signal indicates that the output current does not exceed the threshold value, the hard clipping unit ramps up the clip level.

25 Claims, 6 Drawing Sheets

(56) References Cited

U.S. PATENT DOCUMENTS

| | | | | |
|---|---|---|---|---|
| 6,816,017 | B2 | 11/2004 | Yamashita et al. | |
| 7,317,355 | B2 * | 1/2008 | Zhao et al. | 330/251 |
| 7,333,781 | B1 * | 2/2008 | Stockstad et al. | 455/126 |
| 7,450,916 | B1 * | 11/2008 | Hietala et al. | 455/127.2 |
| 2004/0130472 | A1 | 7/2004 | Arizumi et al. | |
| 2005/0206447 | A1 * | 9/2005 | Yamazaki et al. | 330/129 |
| 2005/0206455 | A1 * | 9/2005 | Yamazaki et al. | 330/285 |
| 2006/0039572 | A1 * | 2/2006 | Mun | 381/106 |
| 2007/0057720 | A1 * | 3/2007 | Hand et al. | 330/10 |
| 2008/0048784 | A1 * | 2/2008 | Shih | 330/298 |
| 2009/0174485 | A1 * | 7/2009 | Teng et al. | 330/298 |

OTHER PUBLICATIONS

Berkhout, M., "Integrated Overcurrent Protection System for Class-D Audio Power Amplifiers," IEEE J. of Solid-State Circuits, vol. 40, No. 11, Nov. 1, 2005, pp. 2237-2245.

Interantional Search Report and Written Opinion for International Application No. PCT/US07/61015, dated Aug. 27, 2008.

Japanese Office Action dated Apr. 12, 2011, in Japanese Patent Application No. 2008-552565.

* cited by examiner

SYSTEMS AND METHODS FOR OVER-CURRENT PROTECTION

Matter enclosed in heavy brackets [ ] appears in the original patent but forms no part of this reissue specification; matter printed in italics indicates the additions made by reissue.

BACKGROUND

1. Field of the Invention

The invention relates generally to digital amplifiers and more particularly to systems and methods for implementing over-current protection in all-digital amplifiers while using simple, low-cost current sensing mechanisms.

2. Related Art

Audio amplifiers are designed to receive input signals that typically have very low voltages and/or currents, and to generate corresponding output signals that generally have much higher voltages and/or currents. Although these higher voltages/currents are necessary to drive speakers and thereby generate an audible signal, this also presents a danger to the speakers. In other words, if the voltage/current is too high, the speakers could be damaged.

In a pulse-width modulation (PWM) amplifier, preventing the amplifier from generating excessive output current (creating an over-current condition) is one of the most critical functions, since this could damage the amplifier's output stages or the speakers driven by the output stages. The amplifier can avoid over-current conditions is various ways. Probably the most straightforward solution is to simply shut down the system whenever an over-current condition occurs. While this approach is effective to prevent the current from reaching damaging levels, as a practical matter it may not be an acceptable solution. For instance, some audio contents will cause short term over-current conditions that are not damaging to the output stages or speakers. In this scenario, shutting down the system does not avoid a damaging condition, but does interrupt the audio output of the system. Obviously, this is not desirable.

In another situation, the input audio signal will result in an over-current condition that is more persistent than the short-term condition described above. This condition may require that some corrective action be taken, but is not so serious that the system must be immediately shut down to avoid damage to the speakers or the system itself. In this situation, it would be preferable for the PWM amplifier to continue to provide audio output and to transition gracefully between a normal operating mode and a corrective operating mode. That is, the transition (as well as the corrective operating mode) should not be accompanied by side effects that significantly impact the performance of the system or produce artifacts in the audible output of the system. If the corrective operating mode is not sufficient to eliminate the over-current condition, the system may be shut down to avoid damage.

It is difficult in a digital amplifier to design an over-current protection system that is both a low-cost solution and meets the above goals. The need for low cost favors the straightforward solution of shutting down the system whenever the output current exceeds a predetermined threshold and resuming operation when the current falls below the threshold. As noted above, this may cause unnecessary interruption of the output audio signal. Moreover, if the system reacts too quickly to the current exceeding and then falling below the threshold, the actual switch rate of the FETs may increase, which may in turn lead to increased heating, which may then damage the FETs. If, on the other hand, the protection system reacts too slowly, the current may reach damaging levels before shut-down occurs. Alternatively, there may be oscillation. That is, when shut-down occurs, the current may drop too much before operation is resumed, then current may ramp back up so that it is too high before shut-down again occurs. Depending on the actual speed of the protection system, the oscillation may be in the audio range, or it may cause other audible effects.

It would therefore be desirable to provide systems and methods for protecting a digital amplifier from over-current conditions, where a simple, low-cost current sensing mechanism is used, but the response to over-current conditions can be more sophisticated than simply shutting down the amplifier.

SUMMARY OF THE INVENTION

This disclosure is directed to systems and methods for implementing over-current protection in all-digital amplifiers using simple, low-cost current sensing mechanisms. In one particular embodiment, a simple over-current sensing mechanism that generates a binary over-current signal is coupled to the output stage of a pulse width modulated (PWM) amplifier. The binary signal is high when the current exceeds a threshold value and low otherwise. The binary signal is provided to a hard clipping unit that is placed in the digital audio signal path before a noise shaper. The hard clipping unit clips the audio signal when it exceeds high or low clip levels. When the binary signal goes from low to high, the hard clipping unit drops its clip level from a current level (e.g., a maximum value that matches the maximum level of the input digital audio signal) to the last value of the digital audio signal (which is assumed to have caused the over-current condition.) The hard clipping unit then decrements the clip level for each PWM switch period during which the binary signal remains high. When the binary signal goes low, the hard clipping unit increments the clip level, continuing until the maximum clip level is reached. The amplifier thereby ramps down the clip level whenever the binary signal indicates that the output current exceeds the current threshold, and ramps the clip level back up whenever the binary signal indicates that the output current is below the current threshold.

It should be noted the audio signals that are being processed using the present systems and methods include both positive and negative excursions from 0. Accordingly, references herein to "ramping down" or "decreasing" clip levels should be construed to include not only decreasing clip levels for positive signals, but also increasing clip levels for negative signals. In other words, the clip level is decreased for the absolute value of the audio signal. Likewise, references herein to "ramping up" or "increasing" clip levels should be construed to include both increasing clip levels for positive signals and decreasing clip levels for negative signals. It should also be noted that references to "high" or "low" clip levels are made with respect to the absolute value of excursions of the audio signal.

One embodiment comprises a method in which an audio input signal is clipped according to a clip level set in a hard clipping unit. The method includes detecting an over-current condition, determining an audio input signal value upon detecting the over-current condition, setting the clip level to an initial value that is less than or equal to the audio input signal value, and decreasing the clip level for each successive time period in which the over-current condition persists. The over-current condition may be indicated by a simple binary over-current signal which may, e.g., be filtered or combined with an enable signal. The method may also include, when the over-current condition does not exist, increasing the clipping level in successive time periods until a maximum clipping level is reached.

An alternative embodiment comprises a digital amplifier including an over-current hard clipping unit and an over-current sensing unit. The hard clipping unit is configured to receive a digital audio signal and clip the digital audio signal according to a clip level. The hard clipping unit provides the clipped signal to a modulator configured to modulate the digital audio signal to produce a modulated (e.g., PWM) audio signal. The modulator provides the modulated signal to an output stage which generates an output current to drive a load (e.g., a speaker.) In this embodiment, the over-current sensing unit is configured to compare the output current to a threshold value and to generate a binary signal which indicates whether the output current exceeds the threshold value. The hard clipping unit is configured to receive the binary signal and to decrease the clip level for each successive time period in which the binary signal indicates that the output current exceeds the threshold value. When the binary signal indicates that the output current does not exceed the threshold value, the hard clipping unit increases the clip level.

Numerous other embodiments are also possible.

BRIEF DESCRIPTION OF THE DRAWINGS

Other objects and advantages of the invention may become apparent upon reading the following detailed description and upon reference to the accompanying drawings.

Figure 1:
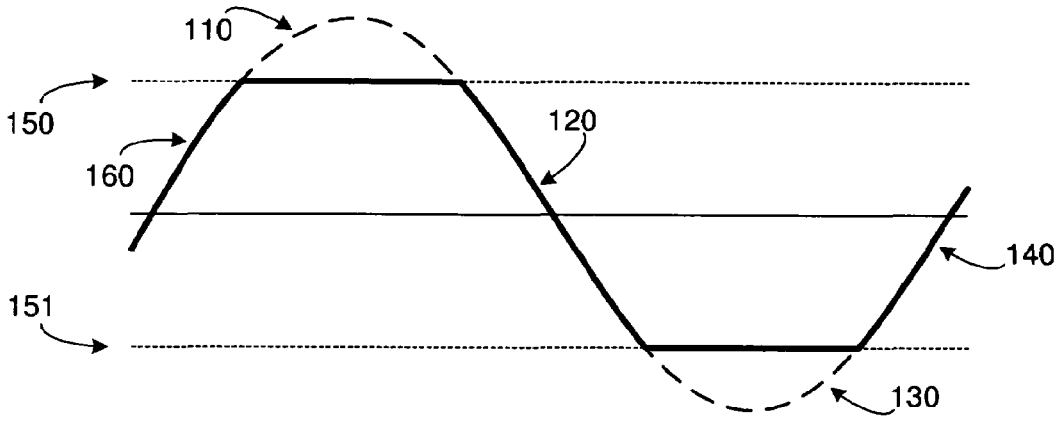
FIG. 1 is a diagram illustrating the clipping of a signal in an analog amplifier.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for implementing over-current protection in all-digital amplifiers while using simple, low-cost current sensing mechanisms.

In one embodiment, a digital pulse width modulation (PWM) amplifier is designed to utilize a simple, low-cost sensing mechanism to monitor the current level at the output of the amplifier and to generate a binary signal that indicates whether the current is above or below a threshold level. Based upon this binary signal, the digital amplifier sets a clipping level for the input signal to emulate the clipping in a typical analog system.

In this embodiment, the current sensing mechanism includes one or more sense resistors that are placed in series with the speakers at the output of the amplifier. The resistance of each sense resistors typically very small. The voltage across each of these sense resistors is measured and compared to a threshold voltage. If the sense resistor voltage is above the threshold voltage, a binary sensor signal is asserted by the comparator. If the sense resistor voltage is below the threshold, the binary sensor signal is not asserted.

The binary signal from the comparator of the current sensing mechanism is provided in this embodiment to a hard-clipper that is placed in the input audio signal path prior to the pulse width modulator. The hard-clipper clips the input digital audio signal when this signal exceeds a clip level which is set within the hard-clipper. Initially, the clip level is set to a maximum value. When the binary signal is asserted, the hard clipper sets the clip level to a value which is equal to the last value of the input digital audio signal, minus a decrement value. This new clip level is used to clip the input digital audio signal for the next PWM period. The hard-clipper continues to decrement the clip level value for each PWM period in which the binary current sensor signal is asserted, ramping down the clip level until the current sensor signal is no longer asserted. When the binary current sensor signal is no longer asserted, the hard clipper begins to ramp the clip level back up until the current sensor signal is again asserted, or the maximum clip level is reached.

As noted above, the use of a simple binary sensing mechanism (i.e., one which generates a binary signal indicating whether or not the current at the output of the amplifier exceeds a threshold value) typically drives the use of an equally simple response in the amplifier (i.e., shutting down the amplifier in order to force the current level to drop below the threshold value. As also noted above, this can cause unnecessary interruption of the audio or potentially damaging oscillation of the current at the output of the amplifier. Because of the unwanted effects of shutting down the amplifier in response to an over-current condition, a better solution is to mimic the over-current based compression implemented in some analog systems. In these systems, the voltage level of the signal is clipped to reduce the current.

Referring to FIG. 1, a diagram illustrating the clipping of a signal in an analog amplifier is shown. In this figure, two waves are depicted. The first is an unclipped sine wave, which is depicted in the figure as a dotted line. The second is the same sine wave after having been clipped at a selected maximum amplitude. The clipped sine wave is shown as a solid line.

It can be seen from FIG. 1 that, as long as the original sine wave remains below the current limiting threshold (indicated by 150 and 151), the wave is not clipped, and the two waves are coincident. The coincident portions of the two waves are indicated by reference numbers 160, 120 and 140. When the original sine wave exceeds the current limiting threshold (150 and 151,) the sine wave is clipped. The clipped wave is therefore flat where the original sine wave peaks in FIG. 1. These portions of the waves are indicated by reference numbers 110 and 130.

There are several factors that complicate the implementation of this clipping in an all-digital amplifier. One of these factors is the use of a low-cost sensing mechanism. The only information provided by this mechanism is an indication of whether or not the output current exceeds a threshold level. The actual current measurement is not available. Likewise, the load impedance may not be available to for use in determining how to control the input signal level. Another complicating factor is the fact that the output current level is not directly tied to the input signal level. In other words, the proportionality between the two may vary. As a result, the desired current limiting functionality cannot be provided by simply clipping the input signal at a predetermined level corresponding to the desired output current limit.

These problems are addressed in the present systems and methods by including a sensing mechanism that generates a binary signal indicating whether the output current exceeds a threshold, and an over-current hard clipping unit that clips the input signal at a level which is dynamically determined based upon the binary over-threshold signal. The sensing mechanism continually provides an indication of whether the output current is over or under the threshold value. When the binary signal is first asserted, the over-current hard clipping unit determines the last value of the digital input signal and sets its clipping level at or just below this value. For as long as the binary signal remains asserted, the hard clipping unit ramps down the level at which it clips the input signal. When the binary signal is deasserted, the hard clipping unit begins to ramp up the level, continuing until the binary signal is again asserted, or a maximum clip level is reached.

Figure 2:
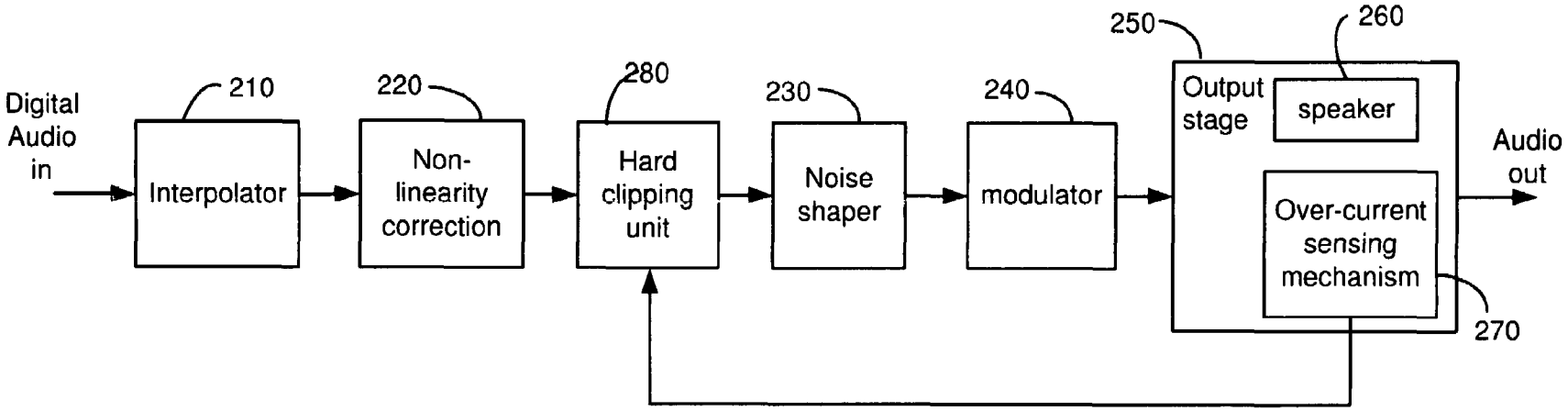
FIG. 2 is a functional block diagram illustrating the structure of a digital amplifier in accordance with one embodiment.

Referring to FIG. 2, a functional block diagram illustrating the structure of a digital amplifier in accordance with one embodiment is shown. The structure depicted in the figure is intended to be illustrative, and other structures may be implemented in alternative embodiments.

In the embodiment of FIG. 2, the input digital audio signal, which is typically a pulse code modulated (PCM) signal, is received by an interpolator 210. The signal is interpolated and provided to a non-linearity correction unit 220. Conventionally, the interpolated and corrected signal would then be conveyed to a noise shaper 230. In the present system, however, the interpolated and corrected signal is passed through over-current hard-clipping unit 280, which clips the signal when necessary (as will be described in detail below) and then passes the clipped input signal to noise shaper 230.

Noise shaper 230 quantizes the received signal and passes the signal to the PWM modulator 240. Noise shaper 230 also shapes the noise spectrum of the audio signal using feedback based on the filtered difference between the input and output audio signals. PWM modulator 240 converts the PCM signal into a pair of pulse width modulated (PWM) signals. These PWM signals are then provided to the output stage 250. Output stage 250 is controlled by the PWM signals to drive speaker 260, creating an audible representation of the audio signal (e.g., music.)

In the embodiment of FIG. 2, a current sensing mechanism 270 is coupled to output stage 250. Current sensing mechanism 270 may, for example, include one or more small sense resistors positioned in series with speaker 260, and a comparator which is configured to compare the voltage across each sense resistor to a threshold voltage. The comparator generates a binary signal which indicates whether the sense resistor voltage is above or below the threshold voltage. The binary signal is then provided to over-current hard clipping unit 280. Hard clipping unit 280 adjusts the level at which it clips the input audio signal based upon the binary signal received from the current sensing mechanism.

Figure 3A:
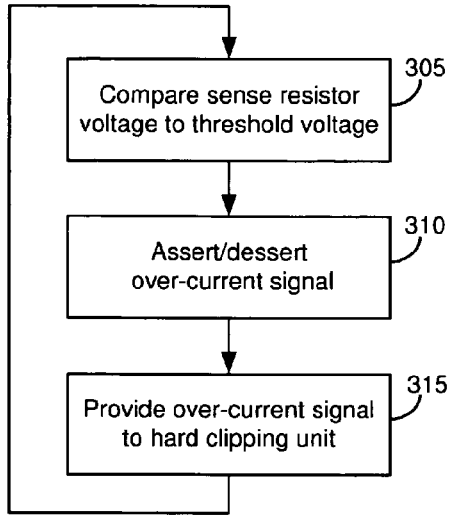
FIGS. 3A and 3B are flow diagrams illustrating the operation of a current limiting mechanism in a digital amplifier in accordance with one embodiment.
Figure 3B:
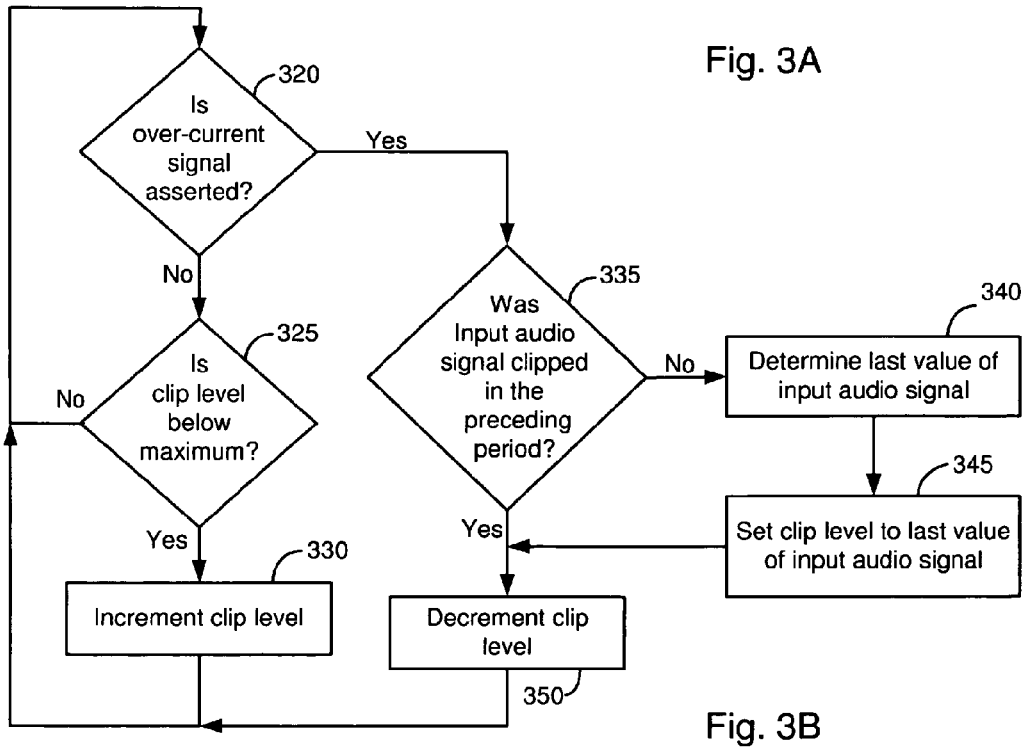

Referring to FIGS. 3A and 3B, a pair of flow diagrams illustrating the operation of a current limiting mechanism in a digital amplifier in accordance with one embodiment are shown. FIG. 3A shows a process for generating a binary over-current signal. This process is continuous in this embodiment. FIG. 3B shows a process for setting the clip level of a hard clipping unit based on the signal generated in the process of FIG. 3A. The flow diagram depicted in FIG. 3B represents a process that is repeated for each PWM switch period.

The process of FIG. 3A begins with a comparison of the sense resistor voltage to a threshold voltage (block 305.) As noted above, the sense resistor is placed in series with the speaker, so the voltage across the sense resistor is proportional to the current through the speaker and sense resistor. The threshold voltage is likewise proportional to a threshold current level through the speaker and sense resistor. Based upon the comparison of the sense resistor voltage and threshold voltage, the current sensing mechanism either asserts or deasserts a binary signal (block 310.) If the sense resistor voltage is greater than the threshold voltage (hence the speaker current is greater than the threshold current,) the signal is asserted. Otherwise, the signal is deasserted. The binary signal may therefore be referred to herein as an over-current or over-threshold signal. The over-current signal is conveyed from the current sensing mechanism to the over-current hard clipping unit (block 315.) This process is continuous.

Referring to FIG. 3B, the hard clipping unit receives the binary over-current signal and determines whether the signal is asserted (i.e., whether the output current is greater than the threshold current) (block 320.) If the over-current signal is not asserted, the hard clipping unit will ramp its clip level back up to its maximum value. As depicted in the figure, the hard clipping unit determines whether or not its clip level is below a maximum level (block 325.) If the clip level is already at its maximum value, no further action needs to be taken by the hard clipping unit, said the process returns to block 305, and the process will be repeated for the next PWM period. If, on the other hand, the clip level is below the maximum level, the hard clipping unit increments the clip level (block 330) before returning to block 305. Multiple iterations of this loop may be necessary to increase the clip level to the maximum value.

If, at block 320, the over-current hard clipping unit determines that the over-current signal is asserted, the input signal level is too high, so the clip level of the unit must be decreased. In order to determine the level at which the clipping should be set, the hard clipping unit needs to determine whether or not the input audio signal was clipped by the unit in the preceding PWM period (block 335.) If the audio signal was not clipped by the hard clipping unit in the preceding period, the unit determines the last value of the input audio signal as a starting point for determining the new clip level (block 340.) It is assumed that the last value of the input audio signal was the value that caused the output current to exceed the threshold level, so the clip level is set to this value (block 345) and then decremented (block 350.) If, at block 335, the hard clipping unit determines that the input audio signal was clipped in the preceding PWM period, the clip level is already below its maximum value, so the unit simply decrements the clip level from its current value (block 350.) In either case, the process then returns to block 320 and is repeated in the following PWM period.

As noted above, the detection of over-current events in this embodiment (as well as the adjustment of the clip level in blocks 320-350) is performed for every PWM switch period (nominally a rate of 384 kHz.) That is, at the start of each switch period, the previous over-current event (if any) is first cleared, and then set only when an over-threshold current is detected within the current switch period. Once the binary signal indicating the over-current condition is set, it will stay set until the next switch period—essentially a one-shot mechanism. Consequently, there is no need for DSP intervention in the implementation of the mechanism. Because the over-current hard clipping unit is placed as closely as possible to the output at which the over-current condition is determined, it will take only a few PWM switch periods to respond effectively, which should be sufficient.

It should be noted that the process described above in connection with FIG. 3 is exemplary, and alternative embodiments may vary from this description. For example, the detection of over-current events and the adjustment of the clip level need not be performed at the PWM switch rate as described above. Also, in the foregoing description, the binary over-current signal is conveyed directly from the comparator of the over-current sensing mechanism to the over-current hard clipping unit. In other embodiments, the binary over-current signal may be processed (e.g., low-pass filtered) before being provided to the hard clipping unit.

Because the clip level of the over-current hard clipping unit is set based upon the current level at the output of the system, the hard clipping unit should be placed (functionally) as close as possible to the output in order to achieve the fastest possible response. In the embodiment of FIG. 2, hard clipping unit 280 is placed between non-linearity correction unit 220 and noise shaper 230, but it could alternatively be placed between noise shaper 230 and modulator 240. The placement of hard clipping unit 280 before noise shaper 230 in the embodiment of FIG. 2, however, may provide benefits such as having greater resolution in the signal (since the noise shaper quantizes the signal to fewer signal levels) and the elimination of excessive clipping in the noise shaper which could cause unstable behavior.

Figure 4:
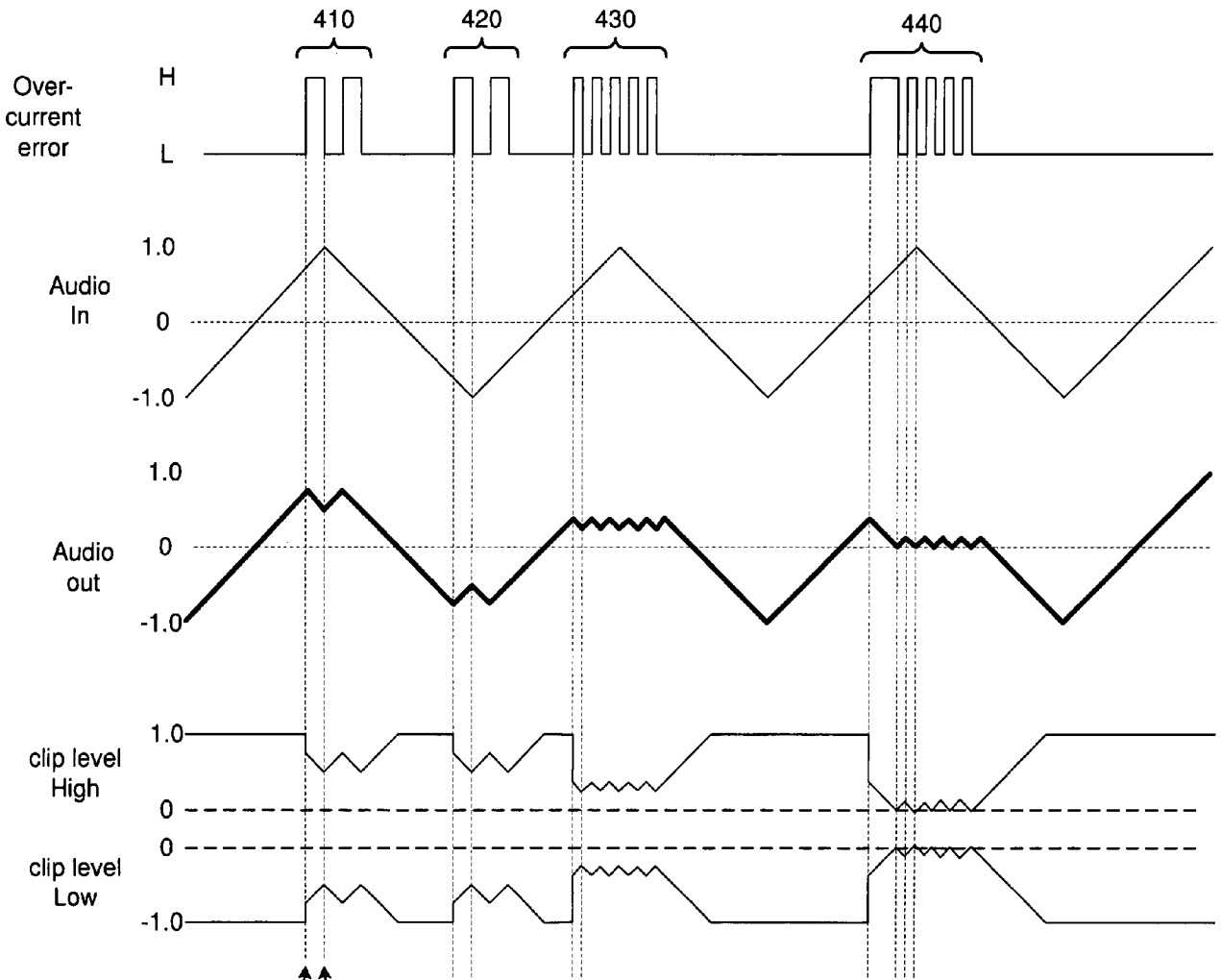
FIG. 4 is a diagram illustrating various signals associated with an over-current protection mechanism in accordance with one embodiment.

Referring to FIG. 4, a diagram illustrating various signals associated with an over-current protection mechanism in accordance with one embodiment is shown. The four signals shown in this figure include the binary over-current signal, the audio signal which is input to the over-current hard clipping unit, the audio signal which is output from the hard clipping unit, and the clip level within the hard clipping unit. The binary over-current signal is shown as having levels of high (H) or low (L). The input and output audio signals and the clip level are all shown with their maximum levels normalized to +/−1.

FIG. 4 shows the signals during an interval which includes four sub-intervals of interest. Initially, the audio input and audio output signals are increasing. The over-current signal has not yet been asserted, and the clip level of the hard clipping unit is set at its maximum level. During the first sub-interval (410,) the over-current signal is asserted at t1. The audio input signal has not yet reached its maximum value. When the over-current signal is asserted, the hard clipping unit immediately drops its clip level to the last value of the audio input signal (which is approximately 80% of its maximum. While the over-current signal remains asserted, the hard clipping unit continues to ramp down its clip level. It can be seen that the output audio signal level is clipped according to the clip level of the hard clipping unit.

When the over-current signal is deasserted at t2, the over-current hard clipping unit begins to ramp up its clip level. The hard clipping unit continues to ramp up the clip level until the over-current signal is again asserted, at which point the hard clipping unit begins ramping down the clip level again. In this instance, the input audio signal remains below the clip level, even as the clip level is decreased, so the signal is not actually clipped. When the over-current signal is deasserted again, the hard clipping unit begins ramping up its clip level, and continues to do so until the maximum clip level is reached.

In sub-interval 420, the over-current signal and the clip levels of the over-current hard clipping unit are the same as in sub-interval 410. The input and output audio signals are the same, except that they are inverted. This simply illustrates that the system is configured to clip the signals according to their absolute values.

In sub-interval 430, the over-current signal is asserted and deasserted in a series of short pulses. As a result, the clip level fluctuates at about 40% of the maximum level. The output audio signal is therefore clipped at about 40% of its maximum value. This clipping emulates the analog clipping that is described in connection with FIG. 1. While similar clipping would typically occur in the negative portion of the audio signal as well, this is not shown in FIG. 4 because of the limited amount of space in the figure.

In sub-interval 440, the over-current signal is asserted and deasserted in a series of pulses that include a long pulse and then several short pulses. As a result, the clip level drops and then fluctuates at about 0-10% of the maximum level. The output audio signal is therefore clipped at about the same normalized level. This clipping corresponds to a situation in which an over-current event is detected and the audio signal is almost entirely suppressed.

Figure 5:
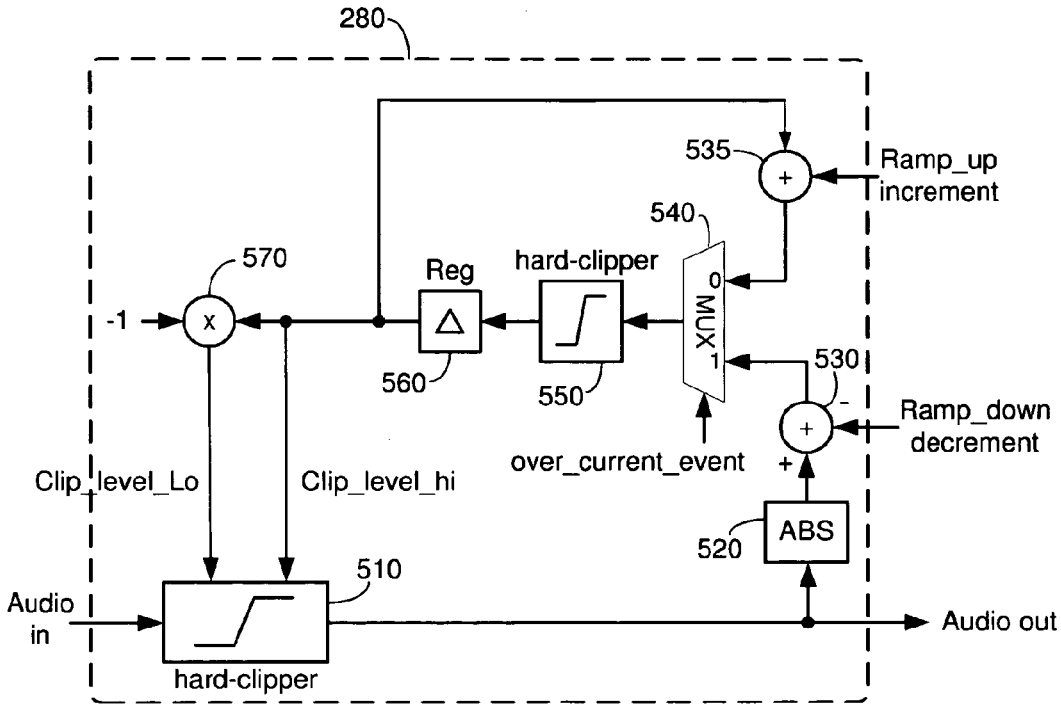
FIG. 5 is a functional block diagram illustrating the structure of an over-current hard clipping unit in accordance with one embodiment.
Figure 6:
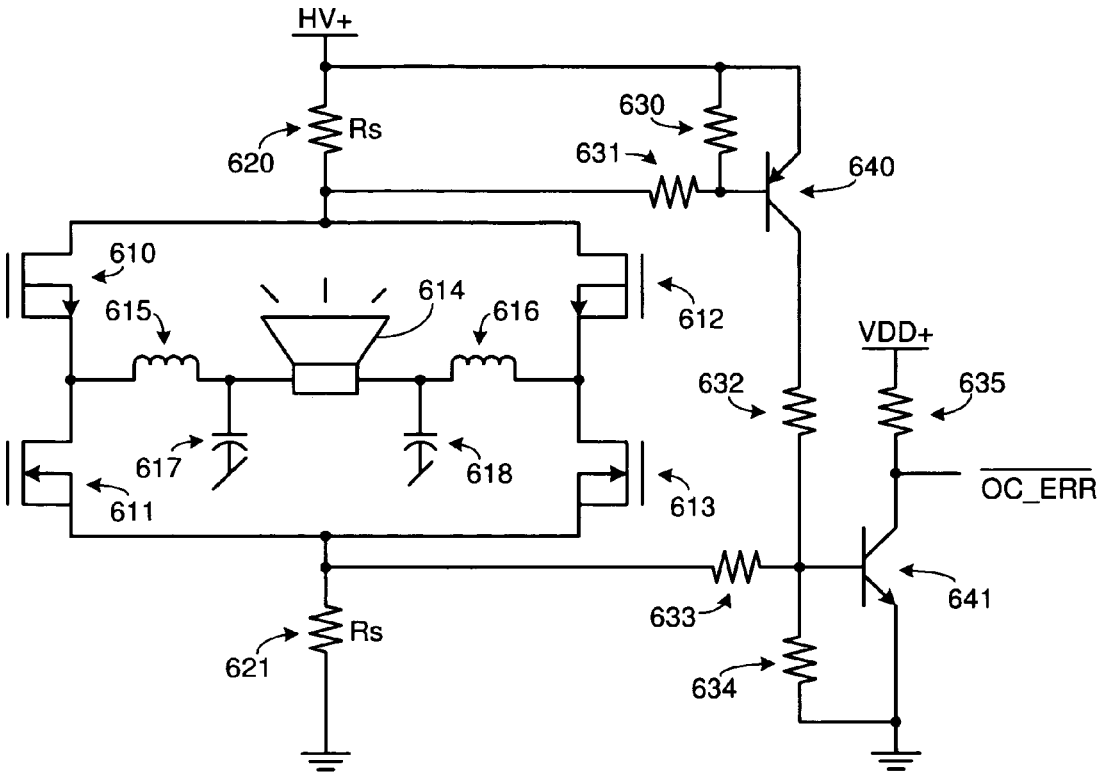
FIG. 6 is a diagram illustrating the structure of an output stage incorporating an over-current sensing mechanism in accordance with one embodiment.

The system described can be implemented in various ways. FIGS. 5 and 6, which will be described below, show exemplary embodiments of the over-current hard clipping unit and over-current sensing mechanism, respectively.

Referring to FIG. 5, a functional block diagram illustrating the structure of an over-current hard clipping unit in accordance with one embodiment is shown. In this embodiment, over-current hard clipping unit 280 includes a first hard clipper 510 which is placed in the audio signal path. The level at which first hard clipper 510 glimpse the input audio signal is determined by high and low clip level inputs (clip_level_hi and clip_level_lo, respectively.) The high and low clip levels are opposites of each other (i.e., clip_level_lo=−clip_level_hi.) The maximum clip level of first hard clipper 510 is set in this embodiment to the maximum signal level of the input audio signal. The absolute value of each of the high and low clip levels is between zero and this maximum clip level. When the clip level of hard clipper 510 is set to its maximum, the input audio signal is passed through hard clipper 510 without modification.

The high and low clip levels of hard clipper 510 are controlled by several additional components, including absolute value unit 520, adders 530 and 535, multiplexer 540, second hard clipper 550, register 560 and multiplier 570. The absolute value of the high and low clip levels used by first hard clipper 510 is stored in register 560. This value is updated every PWM switch period with a value received from second hard clipper 550. Second hard clipper 550 generates this value by clipping a value received from multiplexer 540. Second hard clipper 550 thereby limits the absolute value of the high/low clip levels to a maximum value.

As described above, the level at which over-current hard clipping unit 280 clips the input audio signal is determined by the over-current signal received from the current sensing mechanism. This signal is input to multiplexer 540. Depending upon the over-current signal, multiplexer 540 selects either a value generated by an upper loop (which increments the clip level,) or a value generated by a lower loop (which decrements the clip level.)

When the over-current signal is not asserted, multiplexer 540 selects the value received from adder 535 and passes this value through second hard clipper 550 to register 560. Thus, in a first PWM switch period, register 560 contains a particular value. In the next PWM switch period, this value is incremented (i.e., an incremental value, ramp_up increment, is added to the register value,) clipped by second hard clipper 550 to ensure that it does not exceed the maximum clip level, and then stored in register 560. The value of register 560 is then provided to first hard clipper 510 as the high clip level, and is also inverted by multiplier 570 and provided to first hard clipper 510 as the low clip level. Consequently, as long as the over-current signal is not asserted, the clip level provided to first hard clipper 510 is ramped up until it reaches the maximum clip level, and then is maintained at the maximum clip level.

When the over-current signal is asserted, this causes multiplexer 540 to select the value generated by the lower loop which includes absolute value unit 520 and adder 530. Absolute value unit 520 receives the output of first hard clipper 510. Absolute value unit 520 stores the last value of the clipped audio signal. This value is passed to adder 530, which adds a negative decrement value to it, and then passes the decremented value to multiplexer 540. Multiplexer 540 passes this value to second hard clipper 550, which in turn passes the value to register 560. The value of register 560 and its inverse are then provided to first hard clipper 510 as the high and low clip levels.

When the over-current signal is first asserted, the value stored in absolute value unit 520 is the last audio signal value. This value may be the clip level stored in register 560, or it may be some lower value. If it is the clip level stored in register 560, this value is decremented and stored in register 560, where it will be used to clip the input audio signal in the next PWM switch period. In other words, the system will begin to ramp the clip level down from its current level. If the value stored in absolute value unit 520 is less than the clip level stored in register 560, the audio signal value will be decremented and stored in register 560 to be used to clip the input audio signal in the next PWM switch period. Thus, in this case, the clip level stored in register 560 will drop immediately from the previous clip level to the last audio signal value and will begin ramping downward from that value.

In the embodiment of FIG. 5, it should be noted that the values with which the clip level will be incremented or decremented (via adders 530 or 535) are stored in registers which are not explicitly shown in the figure. In one embodiment, the increment and decrement values in these registers may be programmable. The register values may be set during an initial configuration of the system, and may be modified by a user from time to time, or may be dynamically updated by the system itself (e.g., by a DSP.) The system may also be configured to perform such functions as monitoring a status register for the frequency of over-current events, monitor the compression of the digital audio signal, or shut down the system if the over-current protection mechanisms described herein fail to remedy over-current conditions.

As noted above, the clip level of over-current hard clipping unit 280 is controlled by the over-current signal received from the over-current sensing mechanism. The over-current signal may be used in an unfiltered form, or it may be processed before being used to control the clip level. In one embodiment, the over-current signal is low-pass filtered to remove noise from the signal and eliminate unnecessary modification of the clip level that would be caused by this noise. The number of current signal may also be combined (e.g., AND'ed) with an enable signal. When the enable signal is asserted, the over-current signal is passed to the over-current hard clipping unit and is used to control the clip level as described above. When the enable signal is deasserted, the over-current signal is inhibited, so that the clip level remains at its maximum value and no clipping is performed by the hard clipping unit.

Referring to FIG. 6, a diagram illustrating the structure of an output stage incorporating an over-current sensing mechanism in accordance with one embodiment is shown. In this embodiment, the sensing mechanism is coupled to a full bridge output stage. The conventional components of the output stage include a set of FET's 610-613, inductors 615-616, capacitors 617-618 and speaker 614. FET's 610 and 613 are controlled by a high-side PWM signal, while FET's 611 and 612 are controlled by a low-side PWM signal. When the high-side signal is high and the low-side signal is low, current flows from the current source through sense resistor 620, FET 610, inductor 615, speaker 614, inductor 616, FET 613 and sense resistor 621 to ground. When the high-side signal is low and the low-side signal is high, current flows from the current source through sense resistor 620, FET 612, inductor 616, speaker 614, inductor 615, FET 611 and sense resistor 621 to ground. When the high-side and low-side signals are both low, current flows through inductors 615-616 and speaker 614 in the same direction current was flowing immediately prior to the high-and that low-side signals being equal.

The over-current sensing mechanism includes sense resistors 620-621, and a comparator mechanism configured to compare the voltages across these resistors to threshold values and assert and over-current signal when the threshold values are met and/or exceeded. Sense resistor 620-621 should have small resistance values so that the audio signal driving speaker 614 is not significantly affected by their presence. In this embodiment, the comparator circuit includes resistors 630-635 and bipolar junction transistors 640-641. The selection of particular components (e.g., resistance values) for this circuit depends upon the desired threshold values and various factors that are well understood by persons skilled in the field, so these details will not be discussed here. It will simply be pointed out that the illustrated comparator circuit will assert the binary over-current signal when either of the voltages across sense resistor 620 and sense resistor 621 exceeds the corresponding threshold voltage. In this embodiment, the output of the comparator circuit is normally high, so it would be inverted before being provided to the multiplexer of the hard clipping unit illustrated in FIG. 5.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

[1. A method implemented in a digital amplifier comprising:

detecting an over-current condition;

while the over-current condition exists, ramping down a clipping level at which an audio signal is clipped;

clipping the audio signal according to the clipping level.]

2. [The method of claim 1,] *A method implemented in a digital amplifier that includes an output stage that is driven in dependence on an audio signal, the method comprising:*

*detecting an over-current condition in the output stage that is driven in dependence on the audio signal;*

*while the over-current condition exists in the output stage that is driven in dependence on the audio signal, ramping down a clipping level at which the audio signal is clipped;*

*clipping the audio signal according to the clipping level;* wherein ramping down the clipping level comprises[:]

upon detecting the over-current condition, determining an audio input signal value;

setting the clipping level to an initial clip value that is less than or equal to the audio input signal value; and for each successive time period in which the over-current condition persists, decreasing the clipping level.

3. The method of claim 2, further comprising, when the over-current condition does not exist, increasing the clipping level in successive time periods until a maximum clipping level is reached.

4. The method of claim 2, wherein the digital amplifier is a pulse width modulation (PWM) amplifier and wherein the successive time periods comprise successive PWM switch periods.

5. The method of claim 2, wherein detecting the over-current condition comprises monitoring a current level [at an] *in the* output *stage* of the amplifier, detecting when the current level exceeds a threshold value, and generating a binary signal which indicates whether the current level [at] *in* the output *stage* of the amplifier exceeds the threshold value.

6. The method of claim 5, wherein detecting the over-current condition is performed and the binary signal is updated for each successive time period.

7. The method of claim 5, wherein detecting the over-current condition further comprises low-pass filtering the binary signal.

8. The method of claim 2, wherein clipping the audio input signal comprises clipping the audio input signal that is input to a noise shaper.

9. The method of claim 2, wherein clipping the audio input signal comprises clipping the audio input signal that is input to a modulator.

10. A digital amplifier comprising:

an over-current hard clipping unit configured to receive a digital audio signal and clip the digital audio signal according to a clip level;

a modulator configured to receive the digital audio signal from the over-current hard clipping unit and to modulate the digital audio signal to produce a modulated audio signal;

an output stage configured to receive the modulated audio signal and to generate an output current to drive a load; and an over-current sensing unit configured to compare the output current to a threshold value and to generate an over-current signal which indicates whether an over-current condition exists;

wherein the over-current hard clipping unit is configured to receive the over-current signal and to ramp down the clip level while the over-current condition exists*;*

*wherein in order to ramp down the clip level while the over-current condition exists, the over-current hard clipping unit is configured to*

*set the clip level to a value of the audio signal in the immediately preceding time period minus a decrement value, if the audio signal was not clipped in the immediately preceding time period; and*

*decrease the clip level by the decrement value, if the audio signal was clipped in the immediately preceding time period.*

11. The digital amplifier of claim 10, wherein the over-current sensing unit is configured to compare the output current to a threshold value and to generate the over-current signal as a binary signal which indicates whether the output current exceeds the threshold value.

12. The amplifier of claim 11, wherein the over-current hard clipping unit is configured to receive the binary signal and to decrease the clip level for each successive time period in which the binary signal indicates that the output current exceeds the threshold value.

13. The amplifier of claim 12, wherein the over-current hard clipping unit is further configured to increase the clip level for each successive time period in which the binary signal indicates that the output current does not exceed the threshold value.

14. The amplifier of claim 13, wherein the over-current hard clipping unit is configured to increase the clip level by a programmable amount for each successive time period.

15. The amplifier of claim 12, wherein the over-current hard clipping unit is configured to decrease the clip level by a programmable amount for each successive time period.

16. The amplifier of claim 12, wherein the threshold value to which the over-current sensing unit compares the output current is programmable.

17. The amplifier of claim 12, wherein the digital amplifier is a pulse width modulation (PWM) amplifier, the modulator is configured to modulate the digital audio signal to produce a PWM signal, and the successive time periods comprise successive PWM switch periods.

18. The amplifier of claim 17, wherein the over-current sensing unit is configured to compare the output current to the threshold value and to update the binary signal for each successive time period.

19. [The amplifier of claim 12,] *A digital amplifier comprising:*

*an over-current hard clipping unit configured to receive a digital audio signal and clip the digital audio signal according to a clip level;*

*a modulator configured to receive the digital audio signal from the over-current hard clipping unit and to modulate the digital audio signal to produce a modulated audio signal;*

*an output stage configured to receive the modulated audio signal and to generate an output current to drive a load; and*

*an over-current sensing unit configured to compare the output current to a threshold value and to generate an over-current signal which indicates whether an over-current condition exists;*

*wherein the over-current hard clipping unit is configured to receive the over-current signal and to ramp down the clip level while the over-current condition exists;*

*wherein the over-current hard clipping unit is configured to receive the binary signal and to decrease the clip level for each successive time period in which the binary signal indicates that the output current exceeds the threshold value; and* further comprising a low-pass filter coupled between the over-current sensing unit and the over-current hard clipping unit and configured to low-pass filter the binary signal and provide the filtered binary signal to the over-current hard clipping unit.

20. [The amplifier of claim 12,] *A digital amplifier comprising:*

*an over-current hard clipping unit configured to receive a digital audio signal and clip the digital audio signal according to a clip level;*

*a modulator configured to receive the digital audio signal from the over-current hard clipping unit and to modulate the digital audio signal to produce a modulated audio signal;*

*an output stage configured to receive the modulated audio signal and to generate an output current to drive a load; and*

*an over-current sensing unit configured to compare the output current to a threshold value and to generate an over-current signal which indicates whether an over-current condition exists;*

*wherein the over-current hard clipping unit is configured to receive the over-current signal and to ramp down the clip level while the over-current condition exists;*

*wherein the over-current hard clipping unit is configured to receive the binary signal and to decrease the clip level for each successive time period in which the binary signal indicates that the output current exceeds the threshold value; and* further comprising a noise shaper coupled between the over-current hard clipping unit and the modulator and configured to quantize and filter the digital audio signal received from the over-current hard clipping unit and to provide the quantized and filtered digital audio signal to the modulator.

*21. A method implemented in a digital amplifier that includes an output stage that is driven in dependence on an audio signal, the method comprising:*

*detecting an over-current condition in the output stage that is driven in dependence on the audio signal;*

*while the over-current condition exists in the output stage that is driven in dependence on the audio signal, ramping down a clipping level at which the audio signal is clipped;*

*clipping the audio signal according to the clipping level;*

*wherein ramping down the clipping level comprises*

*if the audio signal was not clipped in the immediately preceding time period, then setting the clipping level to a value of the audio signal in the immediately preceding time period minus a decrement value; and*

*if the audio signal was clipped in the immediately preceding time period, then decreasing the clipping level by the decrement value.*

*22. The method of claim 21, further comprising, when the over-current condition does not exist, increasing the clipping level in successive time periods until a maximum clipping level is reached.*

*23. The method of claim 21, wherein the digital amplifier is a pulse width modulation (PWM) amplifier and wherein the successive time periods comprise successive PWM switch periods.*

*24. The method of claim 21, wherein detecting the over-current condition comprises monitoring a current level in the output stage of the amplifier, detecting when the current level exceeds a threshold value, and generating a binary signal which indicates whether the current level in the output stage of the amplifier exceeds the threshold value.*

*25. The method of claim 21, wherein clipping the audio input signal comprises clipping the audio input signal that is input to one of a noise shaper and a modulator.*

*26. A digital amplifier comprising:*

*an over-current hard clipping unit configured to receive a digital audio signal and clip the digital audio signal according to a clip level;*

*a modulator configured to receive the digital audio signal from the over-current hard clipping unit and to modulate the digital audio signal to produce a modulated audio signal; an output stage configured to receive the modulated audio signal and to generate an output current to drive a load; and*

*an over-current sensing unit configured to compare the output current to a threshold value and to generate an over-current signal which indicates whether an over-current condition exists;*

*wherein the over-current hard clipping unit is configured to receive the over-current signal and to ramp down the clip level while the over-current condition exists;*

*wherein in order to ramp down the clip level while the over-current condition exists, the over-current hard clipping unit is configured to*

*determine an audio input signal value upon receiving the over-current signal which indicates that the over-current condition exists;*

*set the clipping level to an initial clip value that is less than or equal to the audio input signal value; and*

*decrease the clip level, for each successive time period in which the over-current condition persists.*

* * * * *